United States Patent
Guha et al.

(10) Patent No.: US 11,456,357 B2
(45) Date of Patent: Sep. 27, 2022

(54) SELF-ALIGNED GATE EDGE ARCHITECTURE WITH ALTERNATE CHANNEL MATERIAL

(71) Applicant: Intel Corporation, Santa Clara, CA (US)

(72) Inventors: Biswajeet Guha, Hillsboro, OR (US); Anupama Bowonder, Portland, OR (US); William Hsu, Hillsboro, OR (US); Szuya S. Liao, Portland, OR (US); Mehmet Onur Baykan, Beaverton, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 938 days.

(21) Appl. No.: 16/024,125

(22) Filed: Jun. 29, 2018

(65) Prior Publication Data

US 2020/0006487 A1    Jan. 2, 2020

(51) Int. Cl.
*H01L 29/10*     (2006.01)
*H01L 27/092*    (2006.01)
*H01L 29/06*     (2006.01)
*H01L 29/16*     (2006.01)
*H01L 29/161*    (2006.01)
*H01L 21/8238*   (2006.01)
(Continued)

(52) U.S. Cl.
CPC .... *H01L 29/1054* (2013.01); *H01L 21/02532* (2013.01); *H01L 21/02543* (2013.01); *H01L 21/02546* (2013.01); *H01L 21/823807* (2013.01); *H01L 21/823821* (2013.01); *H01L 21/823878* (2013.01); *H01L 27/0924* (2013.01); *H01L 29/0649* (2013.01); *H01L 29/16* (2013.01); *H01L 29/161* (2013.01); *H01L 29/20* (2013.01)

(58) Field of Classification Search
CPC . H01L 29/1054; H01L 29/0649; H01L 29/16; H01L 29/161; H01L 29/20; H01L 29/66545; H01L 21/02532; H01L 21/02543; H01L 21/02546; H01L 21/823807; H01L 21/823821; H01L 21/823878; H01L 21/823412; H01L 21/823431; H01L 27/0924; H01L 27/0886
USPC .......................................... 257/396, 288, 401
See application file for complete search history.

(56) References Cited

U.S. PATENT DOCUMENTS 9,831,306 B2 * 11/2017 Webb ................. H01L 29/66795
10,943,830 B2 * 3/2021 Chiang ........... H01L 21/823468
(Continued)

*Primary Examiner* — Dao H Nguyen
(74) *Attorney, Agent, or Firm* — Schwabe, Williamson & Wyatt, P.C.

(57) ABSTRACT

Techniques are disclosed for forming integrated circuits configured with self-aligned isolation walls and alternate channel materials. The alternate channel materials in such integrated circuits provide improved carrier mobility through the channel. In an embodiment, an isolation wall is between sets of fins, at least some of the fins including an alternate channel material. In such cases, the isolation wall laterally separates the sets of fins, and the alternate channel material provides improved carrier mobility. For instance, in the case of an NMOS device the alternate channel material is a material optimized for electron flow, and in the case of a PMOS device the alternate channel material is a material optimized for hole flow.

19 Claims, 12 Drawing Sheets

(51) Int. Cl.
  *H01L 21/02*   (2006.01)
  *H01L 29/20*   (2006.01)

(56) References Cited

U.S. PATENT DOCUMENTS

| | | |
|---|---|---|
| 2014/0027860 A1   | 1/2014 | Glass et al. |
| 2015/0228772 A1   | 8/2015 | Glass et al. |
| 2016/0225764 A1 * | 8/2016 | Chang ............. H01L 21/823864 |
| 2016/0260802 A1   | 9/2016 | Glass et al. |
| 2019/0067417 A1 * | 2/2019 | Ching ................. H01L 29/0653 |
| 2019/0198400 A1 * | 6/2019 | Miao ................. H01L 29/66666 |

* cited by examiner

SELF-ALIGNED GATE EDGE ARCHITECTURE WITH ALTERNATE CHANNEL MATERIAL

BACKGROUND

Semiconductor devices are electronic components that exploit the electronic properties of semiconductor materials, such as silicon (Si), germanium (Ge), and silicon germanium (SiGe). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Metal-oxide-semiconductor FETs (MOSFETs) include a gate dielectric between the gate and the channel. Complementary MOS (CMOS) structures use a combination of p-channel MOSFET (PMOS) and n-channel MOSFET (NMOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin).

Figure 1:
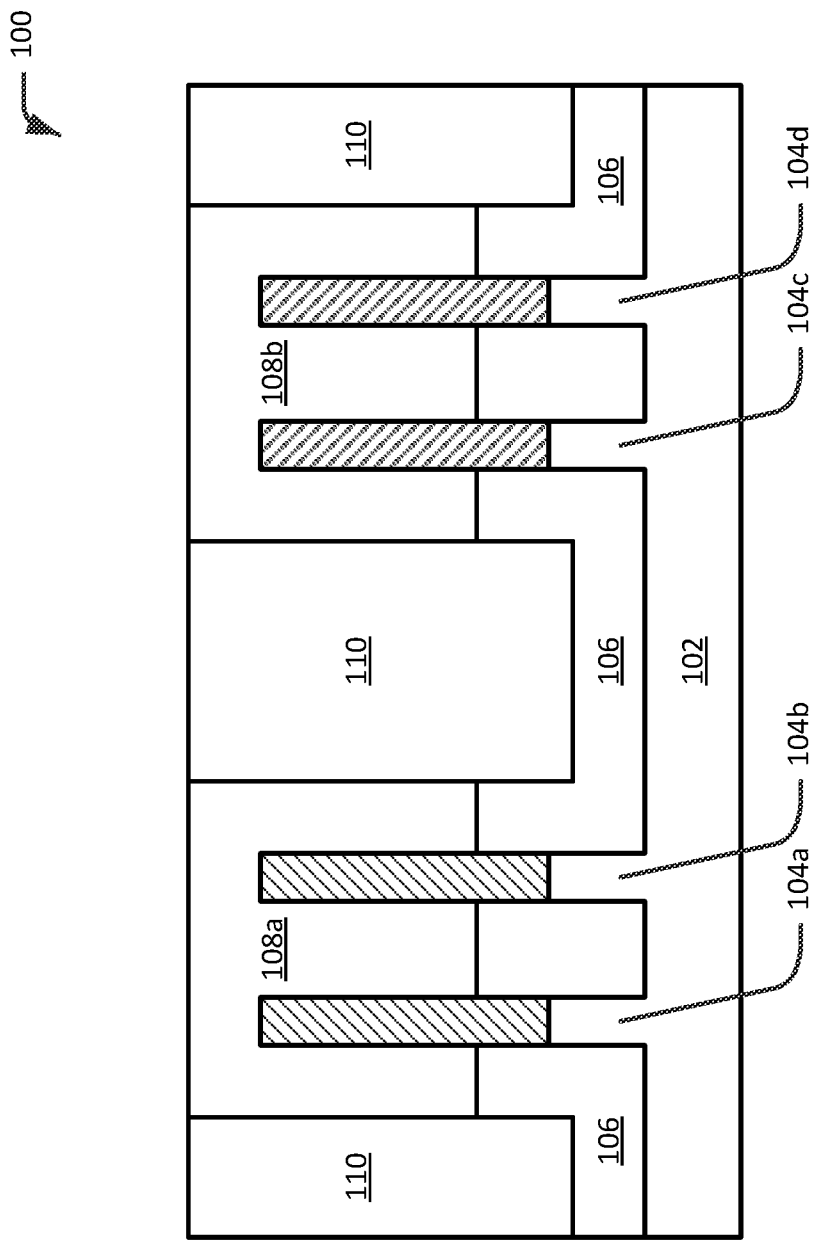
FIG. 1 illustrates a cross-sectional view of an integrated circuit structure including self-aligned isolation walls and alternate channel materials, in accordance with an embodiment of the present disclosure.

These and other features of the present embodiments will be understood better by reading the following detailed description, taken together with the figures herein described.

Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Integrated circuits including self-aligned isolation walls and alternate channel materials and methods of forming the same are disclosed. As used herein, an alternate channel material is a material that is compositionally different from the substrate material on which the channel material rests. In an embodiment, the integrated circuit including self-aligned isolation walls integrates alternate channel materials on different areas of a silicon substrate. For instance, for CMOS structures, an alternate channel material for n-channel devices (e.g., NMOS devices) and/or an alternate channel material for p-channel devices (e.g., PMOS devices) are formed on the silicon substrate. Examples of alternate channel materials for NMOS devices include silicon (Si), germanium (Ge), and a group III-V semiconductor material such as indium gallium arsenide (InGaAs) or indium phosphide (InP), to name a few examples. Examples of alternate channel materials for PMOS devices include Ge, silicon germanium (SiGe), and SiGe doped with carbon (SiGe:C), to name a few examples. Note that the alternate channel material may be the same for NMOS and PMOS. In such cases, different doping schemes can be used, as will be appreciated, such as boron or gallium or other p-type dopant for PMOS devices, and silicon or magnesium or other n-type dopant for NMOS devices. In any such cases, the alternate channel material may provide improved and, in some instances, significantly improved carrier mobility in NMOS devices and PMOS devices on a silicon or other suitable substrate including self-aligned gate edge isolation structures, as will be appreciated.

General Overview

As previously explained, the channel is a conductive region that connects the source and drain in a FET device, when proper biasing is applied. One factor in the design of semiconductor transistor devices is the mobility of the carrier flowing within the channel. Improved carrier mobility (e.g., how fast the carrier moves through the channel) translates to improved semiconductor performance. However, existing solutions commonly use silicon as the channel material, and carrier mobility provided by silicon channels is finite. Another factor is the isolation between transistors, to prevent short circuiting, interference, and/or transistor-to-transistor leakage. To this end, isolation material can be provisioned between neighboring devices. However, providing such isolation in a consistent and aligned fashion, particularly as scaling continues into the nanometer range, is difficult. For instance, if the isolation material is not properly aligned between two transistors, the gate structures of two transistors may be unacceptably asymmetrical (e.g., different sizes and/or lopsided to an extent that adversely impacts transistor device performance).

Thus, techniques are disclosed herein for forming integrated circuits configured with self-aligned isolation walls and alternate channel materials. The alternate channel materials in such integrated circuits including self-aligned isolation walls may provide improved carrier mobility through the channel as compared to silicon channels. In an embodiment, the alternate channel material can be formed by upfront patterning a silicon substrate to expose target transistor areas (NMOS or PMOS regions), etching out the silicon in those areas to provide one or more trenches, and depositing the appropriate alternate channel material into the trench(es). The silicon substrate with the alternate channel material can then be patterned and etched to form fins, including fins comprising the alternate channel material. A conformal isolation structure can be formed between fins (or between sets of fins), wherein the isolation structure includes multiple etch-selective layers, thereby allowing for formation of an isolation wall between fins (or between sets of fins). The conformal nature of the isolation structure allows the resulting isolation wall to be self-aligned to the neighboring fins, and therefore effectively provides self-aligned isolation walls. In other embodiments, the alternate channel material is formed subsequent to formation of the fins and the self-aligned isolation walls, by way of a fin replacement process. For instance, a silicon substrate is patterned and etched to form the fins, and the self-aligned isolation walls are formed between the fins. The fully formed silicon fins can then be selectively etched out, and the appropriate alternate channel material is deposited in the resulting trench. An example integrated circuit configured in accordance with any such embodiment may include, for instance, a self-aligned isolation wall separating an NMOS device having channel material optimized for electron flow and a PMOS device having channel material optimized for hole flow. In some such example cases, optimal channel materials for NMOS devices include Si, Ge, or a group III-V semiconductor material such as InGaAs or InP, and optimal channel materials for PMOS devices include Ge, SiGe, or SiGe:C.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate the presence of two gate structures separated by a self-aligned isolation structure, where one or both gate structures are formed over alternate channel materials. For example, TEM can be useful to show a cross section of the device structure, including an isolation wall aligned between two gated channel regions of materials distinct from the underlying substrate. In another example, x-ray crystallography can be useful to illustrate the crystal quality of the alternate channel material. In some embodiments, the techniques described herein may be detected based on the benefits derived from their use, which include improved carrier mobility in self-aligned gate edge architecture devices, relatively less energy consumption, and/or other improved device performance. Numerous configurations and variations will be apparent in light of this disclosure.

Materials that are compositionally different as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally different may further refer to two materials that have different crystallographic orientations. For instance, (110) silicon is different from (100) silicon. Creating a stack of different orientations could be accomplished, for instance, with blanket wafer layer transfer.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Architecture and Methodology

FIG. 1 illustrates a cross-sectional view of an integrated circuit structure 100 including self-aligned isolation walls and alternate channel materials, in accordance with an embodiment of the present disclosure. As shown in FIG. 1, integrated circuit structure 100 is depicted through a fin cut perspective (perpendicular to the fins and through the gate/channel region). Integrated circuit structure 100 includes semiconductor fins 104a-104d above a semiconductor substrate 102. Although each fin shown in FIG. 1 is illustrated as having the same size and shape relative to one another, it will be appreciated that the present disclosure is not intended to be so limited. For example, in some embodiments, the fins may be formed to have varying heights and/or varying widths and/or varying shapes. Also note that four fins are shown for ease of illustration, and any number of fins may be present, such as one, two, three, five, ten, hundreds, thousands, millions, and so forth, as can be understood based on this disclosure. In this example embodiment, fins 104 each include a fin stub portion and an alternate channel material portion. In other embodiments, however, and as will be appreciated in light of this disclosure, the fin forming process may not leave or otherwise provide any fin stubs. In still other embodiments, note that the alternate channel material portions may be configured as multilayer stacks suitable for forming nanowires or nanoribbons. In such case, the stack may include, for instance, alternating layers of sacrificial material and alternate channel material. Once the channel region is exposed during gate processing, the sacrificial material can be removed so as to liberate the nanowires or nanoribbons, followed by gate stack formation.

In some embodiments, semiconductor substrate 102 is a bulk silicon substrate, such as monocrystalline silicon. In other embodiments, semiconductor substrate 102 may be formed using other materials, which may or may not be combined with silicon, such as germanium, SiGe, indium antimonide (InSb), lead telluride, indium arsenide (InAs), InP, InGaAs, gallium arsenide (GaAs), or gallium antimonide (GaSb). In a more general sense, any material that may serve as a foundation upon which a semiconductor device may be built or otherwise formed can be used in accordance with embodiments of the present disclosure. The stub portions of semiconductor fins 104 are continuous with and protrude from substrate 102. As can further be seen, the alternate channel material (generally shown with diagonal hatching) is on the fin stubs and extends above an insulator layer 106. The alternate channel material may be any material that is compositionally different from substrate 102 material, such as any suitable group IV (e.g., germanium or SiGe) or III-V semiconductor material (e.g., GaAs, InGaAs, InP, InAs, or GaSb). Insulator layer 106 can be formed from any suitable insulator material, such as, for example, silicon dioxide ($SiO_2$).

A gate structure 108 is over one or more of semiconductor fins 104. For example, two gate structures 108a and 108b are depicted, each formed over a pair of semiconductor fins 104 (gate structure 108a is over fins 104a and 104b, and gate structure 108b is over fins 104c and 104d). Note that two gate structures are shown for ease of illustration, and any number of gate structures may be formed. Also note that, although each set of semiconductor fins shown in FIG. 1 is illustrated as comprising two semiconductor fins, it will be appreciated that the present disclosure is not intended to be so limited. For example, in other embodiments, the number of semiconductor fins over which a given gate structure is formed may be a different number of semiconductor fins, such as one, three, or more semiconductor fins. Further, the sets of semiconductor fins can be composed of the same number of semiconductor fins or different numbers of semiconductor fins. For example, in some embodiments, gate structure 108a may be formed over a first set of semiconductor fins, and gate structure 108b may be formed over a second set of semiconductor fins, where the first set and the second set are composed of a different number of semiconductor fins. Gate structure 108 includes a gate dielectric layer and a gate electrode. In one specific example case, the gate structure includes a silicon dioxide gate dielectric layer and a polysilicon or tungsten gate electrode. In still other embodiments, the gate dielectric layer includes multiple components such as a lower layer of standard dielectric (e.g., such as silicon dioxide) on the channel region, and an upper layer of high-k dielectric (e.g., such as hafnium oxide) on the standard dielectric layer. Example high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Likewise, the gate electrode structure may include multiple components in some embodiments, such as work function metals (for p-type gate electrode or n-type gate electrodes) and/or barrier materials surrounding a metal core or plug. Any number of gate stack configurations can be used, whether high-k or not, as will be appreciated. Other transistor features, such as source/drain regions to either side of a given channel region or gate structure, and trench-based source/drain contacts, are not shown, but will be apparent.

A self-aligned isolation wall 110 laterally separates adjacent gate structures 108. In some embodiments, isolation wall 110 is centered between adjacent sets of semiconductor fins 104, due to the conformal nature of its forming process. A portion of two other isolation walls 110 are also shown in FIG. 1. In other embodiments, note that there may be an isolation wall between each individual fin, rather than between fin groups. Likewise, in other embodiments, only select fins or fin groups may be separated by isolation walls. Numerous such configurations will be apparent in light of this disclosure. In the example of isolation wall 110 laterally separating gate structures 108a and 108b, in one embodiment, isolation wall 110 is centered between semiconductor fins 104b and 104c. In other embodiments, a difference between the distance between the left sidewall of isolation wall 110 and the right sidewall of semiconductor fin 104b and the distance between the right sidewall of isolation wall 110 and the left sidewall of semiconductor fin 104c is 2 nm or less, 1 nm or less, or 0.5 nm or less. In yet other embodiments, a difference between the distance between the left sidewall of isolation wall 110 and the right sidewall of semiconductor fin 104b and the distance between the left sidewall of semiconductor fin 104a and the right sidewall of isolation wall 110 to the left of gate structure 108a is 2 nm or less, 1 nm or less, or 0.5 nm or less.

Isolation walls 110 may be composed of a material or materials suitable to electrically isolate at least portions of neighboring gate structures from one another, and further to provide etch selectivity with respect to insulator layer 106. Isolation walls 110 may include, for instance, one or more etch resistant materials and/or layers, such as materials and/or layers that have a relatively low etch rate compared to the etch rate of silicon dioxide, for a given etch chemistry. For instance, in one specific example embodiment having silicon substrate 102, insulator layer 106 comprises $SiO_2$, and isolation walls 110 comprise a body of silicon nitride (for a low etch rate relative to layer 106) and a hafnium oxide cap at the top of the silicon nitride body. Other embodiments may use any number of other suitable isolation insulator materials that provide etch selectivity with respect to insulator 106. For instance, and in general, insulator layer 106 material can be the native oxide of substrate 102 material, or some other oxide insulator. The body of isolation wall 110 can be any material having a lower etch rate than insulator layer 106 material. For instance, nitrides and carbides tend to have relatively much lower etch rates than oxides, such as 3× or lower, for a given etch scheme. The cap, if present and according to some embodiments, further supports a low etch rate and can be, for instance, an oxide, nitride, or carbide employing any common metal, such as titanium, hafnium, aluminum, scandium, yttrium, zirconium, niobium, ruthenium, tantalum, lanthanum, and lutetium. In general, the cap should have relatively high resistivity (comparable to insulator layer 106 material). In any such cases, note that the materials making up the isolation between fins (or fin groups, as the case may be) can be provided via atomic layer deposition (ALD) to provide a conformal or otherwise relatively uniform deposition. Using such a conformal deposition process, note that isolation walls 110 are effectively self-aligned within the corresponding insulator layer 106.

Figure 2:
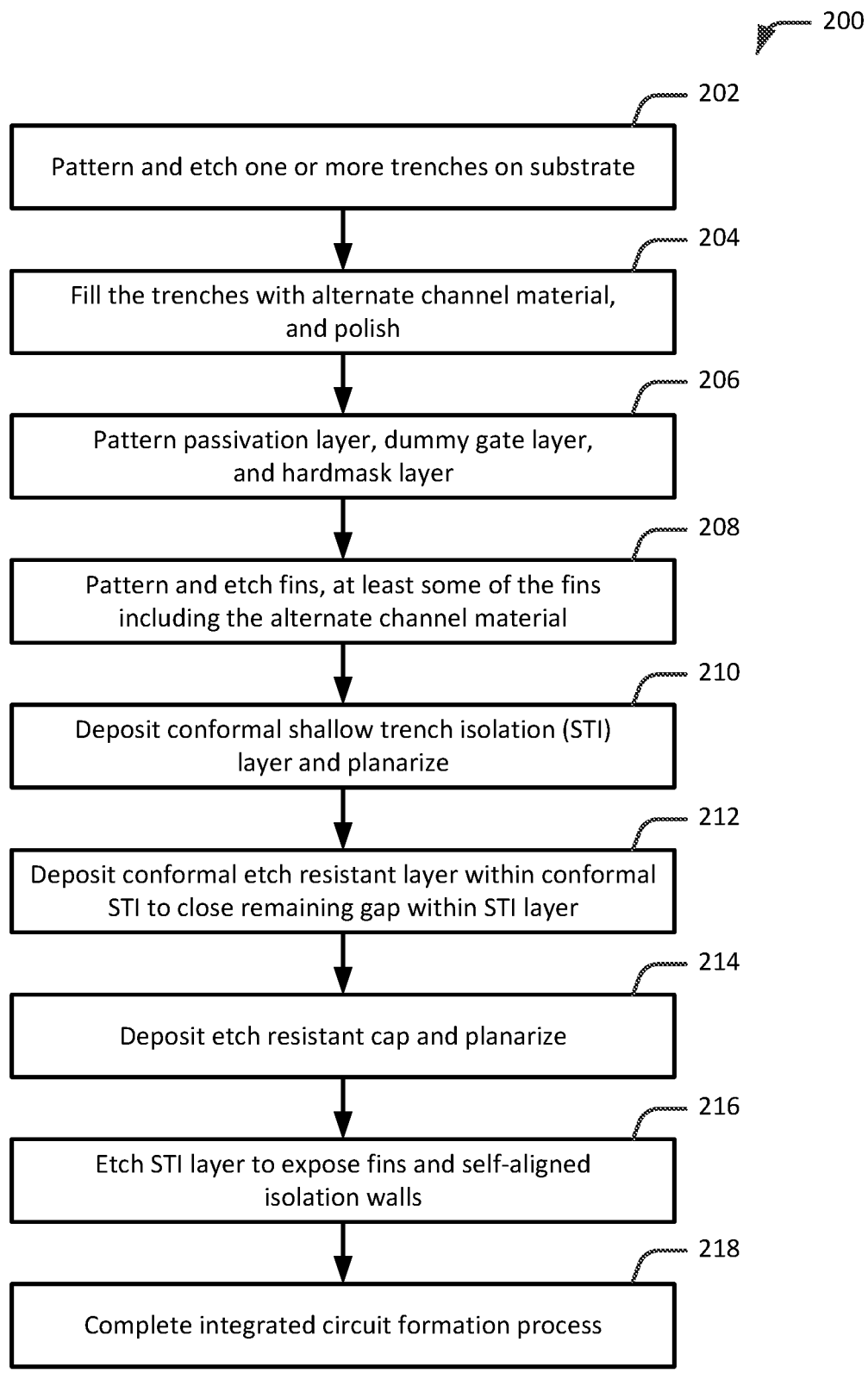
FIG. 2 is a flow diagram illustrating an example process for forming an integrated circuit structure that includes a self-aligned isolation wall and alternate channel material, in accordance with an embodiment of the present disclosure.

FIG. 2 is a flow diagram illustrating an example process 200 for forming an integrated circuit structure that includes a self-aligned isolation wall and alternate channel material, in accordance with an embodiment of the present disclosure. FIGS. 3A-3H illustrate structures that are formed when carrying out process 200 of FIG. 2, in accordance with an embodiment of the present disclosure. Concurrent reference to FIG. 2 and FIGS. 3A-3H will facilitate explanation.

As will be further appreciated in light of this disclosure, for this and other processes and methods disclosed herein, the functions performed in the processes and methods may be implemented in differing order. Additionally or alternatively, two or more operations may be performed at the same time or otherwise in an overlapping contemporaneous fashion. Furthermore, the outlined actions and operations are only provided as examples, and some of the actions and operations may be optional, combined into fewer actions and operations, or expanded into additional actions and operations without detracting from the essence of the disclosed embodiments.

Figure 3A:
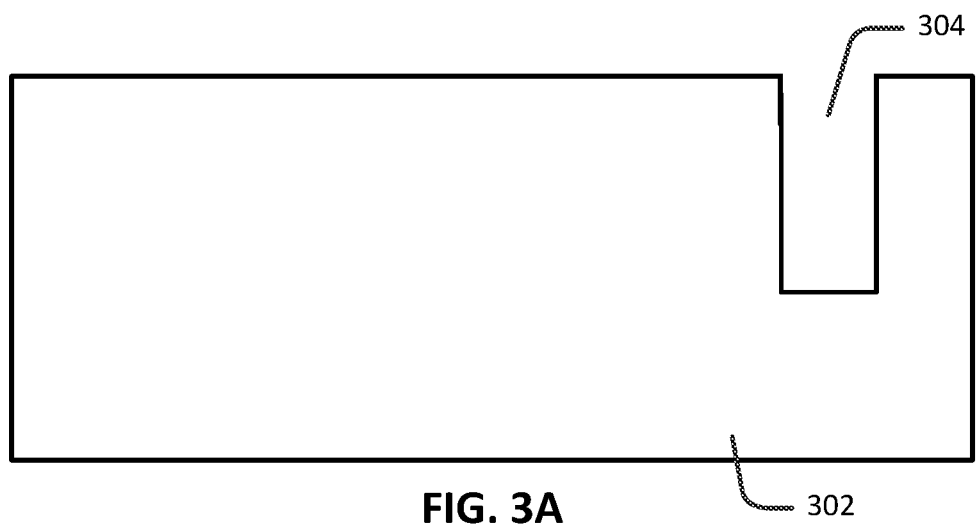
FIGS. 3A to 3H illustrate structures that are formed when carrying out the process of FIG. 2, in accordance with an embodiment of the present disclosure.

With reference to process 200 of FIG. 2, at block 202, a silicon substrate is patterned to expose one or more target transistor areas and etched to provide corresponding trenches. FIG. 3A shows an example substrate 302 after this patterning and etching to expose a trench 304. Note that one trench is shown for ease of illustration, and any number of trenches can be exposed. Also note that, in the case of multiple trenches, the geometry (width, depth, shape, etc.) of the trenches can vary between trenches as will be appreciated. Any number of suitable substrate configurations can be used, including bulk substrates, semiconductor-on-insulator substrates (XOI, where X is a semiconductor material such as Si, Ge, or Ge-enriched Si), and multi-layered structures. In a more general sense, any substrate upon which fins can be formed prior to a subsequent transistor formation process can be used. In one specific example case, substrate 302 is a bulk silicon substrate. Substrate 302 can be patterned and etched to provide one or more trenches using any number of standard patterning and etch processes. For instance, in some embodiments, a resist can be patterned on the portions of substrate 302 using standard lithography. The resist patterned on the portions of substrate 302 protects the underlying regions of substrate 302 from the etching process. The patterned substrate 302 can then be etched (e.g., using dry etch, wet etch, or other suitable substrate removal process) to remove the unmasked (no resist) portions of substrate 302 to provide trench 304. The remaining resist material can then be stripped, thereby leaving substrate 302 including trench 304.

Figure 3B:
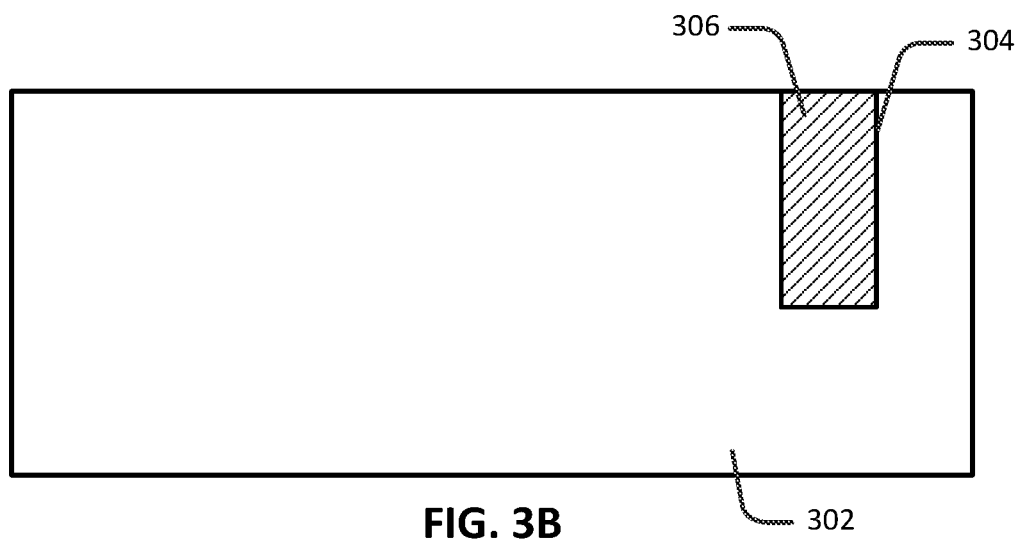

At block 204, the alternate channel material is deposited into the etched trenches, followed by polishing (e.g., planarization) to remove any excess materials. FIG. 3B shows an example resulting structure after deposition of an alternate channel material 306, and polishing, according to one embodiment. As can be seen in this example case, trench 304 has been filled by way of epitaxial growth with a particular semiconductor material, alloy or compound (e.g., Si, Ge, SiGe, SiGe:C, or group III-V semiconductor materials for NMOS; Ge, SiGe, or SiGe:C for PMOS). The epitaxial material can be configured as desired with respect to any number of parameters of interest, such as layer thickness, polarity, doping, composition and/or strain. Note that the epitaxial deposition may result in some excess material that extends from the surface of substrate 302 and may be misshapen, faceted, or irregular. Such excess material can be removed by polishing to be co-planar with substrate 302 as further shown in FIG. 3B. Any suitable deposition techniques such as chemical vapor deposition (CVD), physical layer deposition (PVD), atomic layer deposition (ALD), rapid thermal CVD (RT-CVD), and gas-source molecular beam epitaxy (GS-MBE) can be used to provide alternate channel material 306.

Figure 3C:
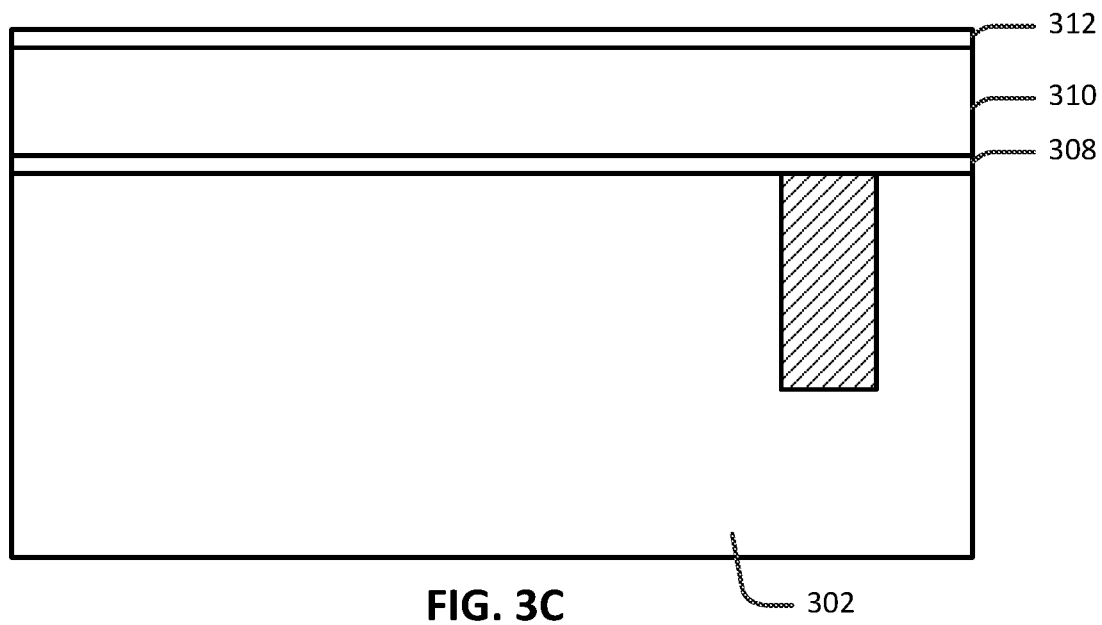

At block 206, a passivation layer, a dummy gate layer, and a hardmask layer are patterned on top of the silicon substrate including the deposited alternate channel material. FIG. 3C shows an example resulting structure after deposition of a passivation layer 308, a dummy gate layer 310, and a hardmask layer 312, according to one embodiment. Passivation layer 308, dummy gate layer 310, and hardmask layer 312 can be provisioned on substrate 302 using any number of standard deposition processes. Passivation layer 308 may be, for example, any suitable passivation material such as silicon dioxide, silicon nitride, or silicon carbide. Dummy gate layer 310 may be, for example, any suitable dummy gate material such as polycrystalline silicon. Hardmask layer 312 may be, for example, any suitable material that supports a low etch rate, such as an oxide, a nitride, or a carbide employing any common metal.

Figure 3D:
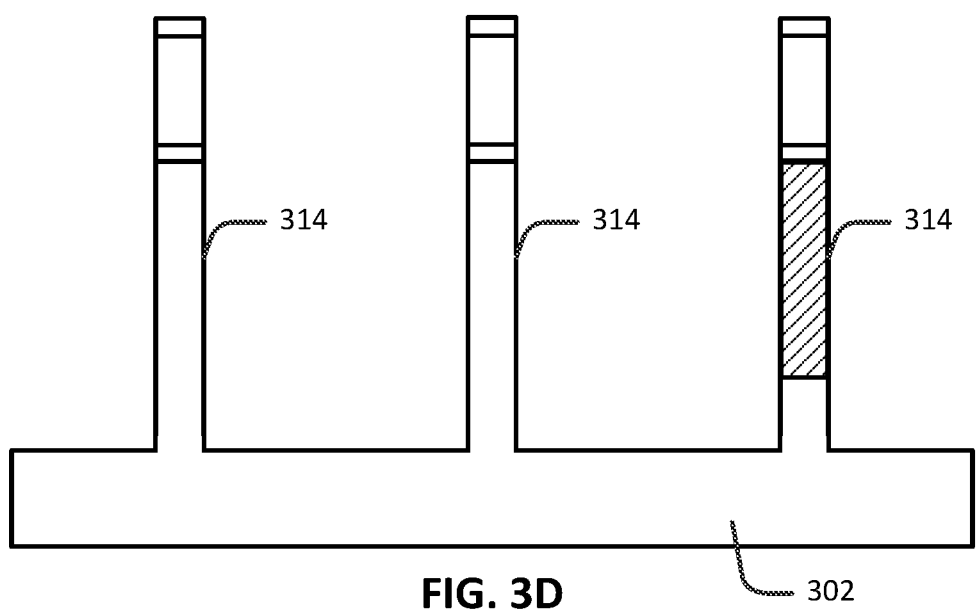

At block 208, the substrate is patterned and etched to form fins on the substrate. FIG. 3D illustrates an example of the resulting structure after formation of fins 314 on substrate 302, according to one embodiment. Note that at least some of the fins include alternate channel material 306. Further note that, as illustrated, alternate channel material 306 (generally shown with diagonal hatching) is on a fin stub that is of the same material as (or native to) substrate 302. Fins 314 can be formed using any number of suitable etch processes (e.g., et and/or dry etching), but in one embodiment, fins 314 can be formed on substrate 302 using a shallow trench recess (STR) etch process that employs a directional (anisotropic) dry etch. Note that, although three fins 314 are shown in FIG. 3D, any number of fins 314 can be formed, and in any desired pattern or configuration suitable for a given application. The geometry of the trenches (width, depth, shape, etc.) can vary from one embodiment to the next as will be appreciated, and the present disclosure is not intended to be limited to any particular trench geometry.

While the illustrated embodiment shows fins 314 as having a width that does not vary with distance from substrate 302, fins 314 may be tapered such that they are narrower at the top than the bottom in another embodiment, wider at the top than the bottom in another embodiment, or having any other width variations and degrees of uniformity (or non-uniformity). Further note that the width variation may, in some embodiments, be symmetrical or asymmetrical. Also, while fins 314 are illustrated as all having the same width, some fins may be wider and/or otherwise shaped differently than others. For example, in an embodiment, fins 314 to be used in the creation of NMOS transistors may be narrower than fins 314 to be used in the creation of PMOS transistors, or vice-versa. In some embodiments, fins 314 including the alternate channel material may be narrower than fins not including the alternate channel material (native fins), or vice-versa. In a more general sense, the fins can be patterned to have widths that are much narrower relative to, for instance, planar transistor technologies even for the same process node.

Figure 3E:
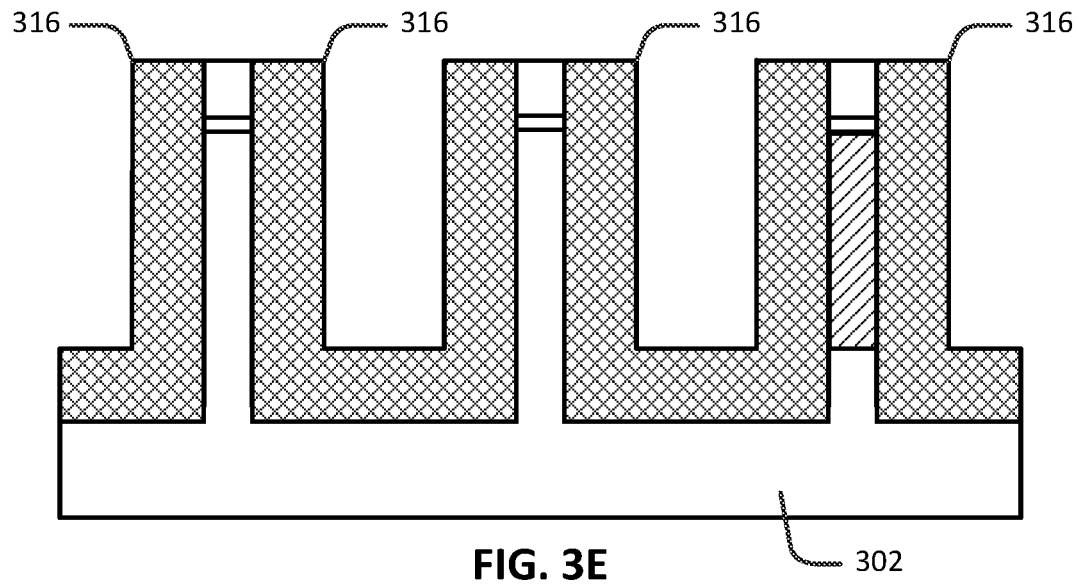

At block 210, a conformal shallow trench isolation (STI) layer is deposited in the trenches between the fins, and planarized. FIG. 3E illustrates an example of the resulting structure after deposition of STI layer 316 in the trenches (and planarization to remove excess STI material), according to one embodiment. STI layer 316 can be provided using any number of suitable deposition processes, but in one embodiment, STI layer 316 is provided using a conformal deposition process such as atomic layer deposition (ALD), followed by a planarization process. ALD provides a conformal or otherwise relatively uniform deposition. Using such a conformal deposition process, note that the isolation walls are effectively self-aligned within the corresponding body of STI 316 material. In one specific embodiment having a silicon substrate 302, STI layer 316 is $SiO_2$. In other embodiments, STI layer 316 can be other suitable insulator materials that provides a desired etch selectively with respect to the subsequently deposited isolation wall. For instance, and in general, STI layer 316 material can be the native oxide of substrate 302 material, or some other oxide insulator.

Figure 3F:
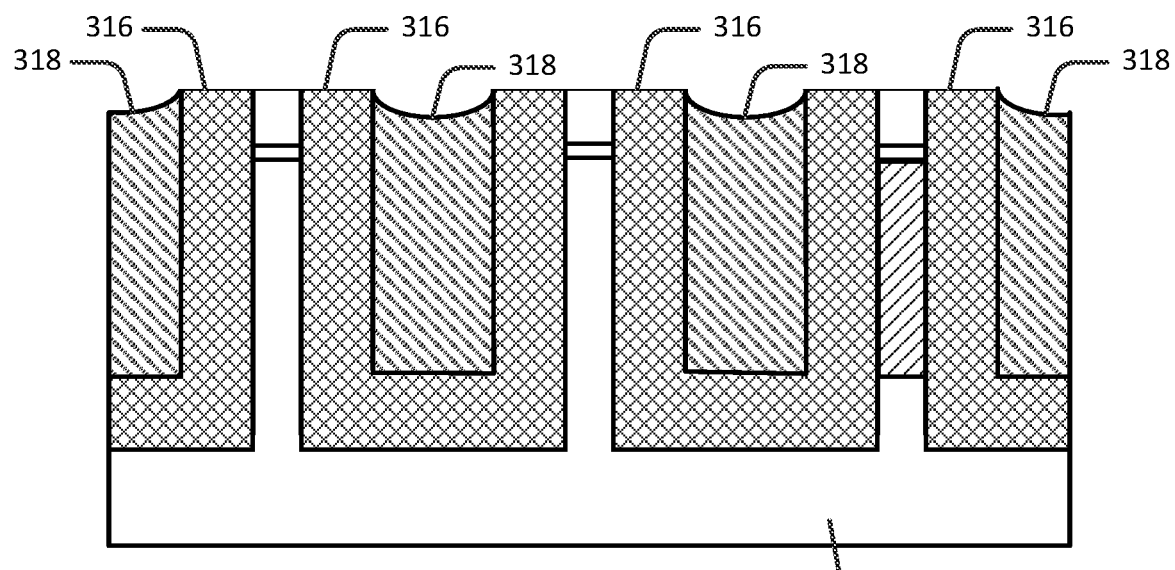

At block 212, a conformal etch resistant layer is deposited within the conformal STI to close remaining gap within the STI layer. FIG. 3F illustrates an example of the resulting structure after deposition of conformal etch resistant layer 318 in the various troughs or gaps within STI layer 316, according to one embodiment. Etch resistant layer 318 can be provided using any number of suitable deposition processes, but in one embodiment, etch resistant layer 318 is provided using ALD, such that etch resistant layer 318 material closes the remaining gaps within STI layer 316 material and pinches off on itself proximate the top of each such gap. Continuing with the specific example embodiment described previously having a silicon substrate 302 and a $SiO_2$ STI layer 316, etch resistant layer 318 material is silicon nitride, in some such cases. According to an embodiment, the etch resistant layer formed in the troughs or gaps of STI layer 316 between the fins (or sets of fins) compose the conformal isolation structure.

Figure 3G:
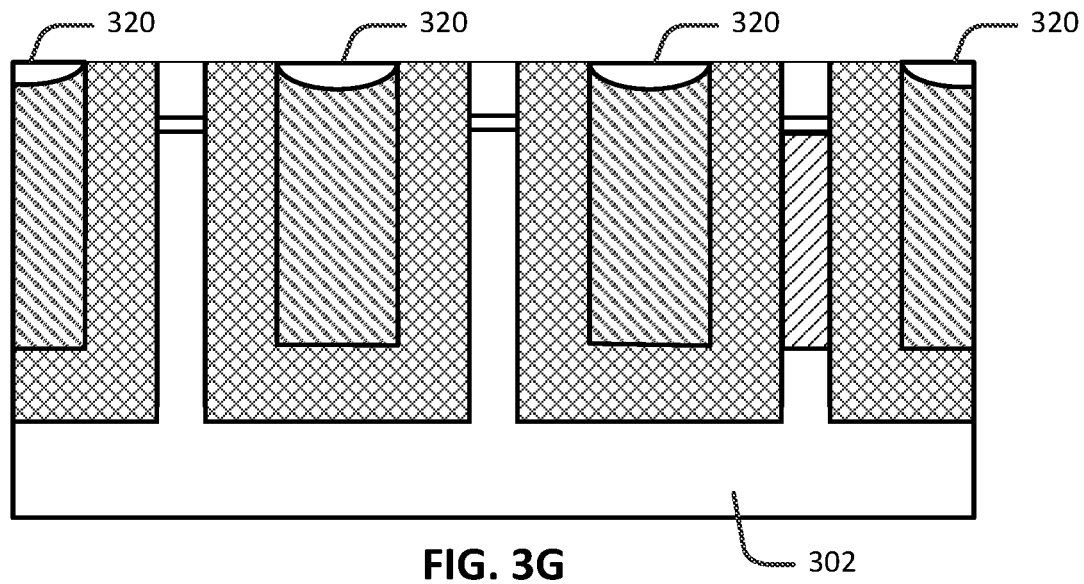

At block 214, an etch resistant cap is deposited over the etch resistant layer, and planarized. FIG. 3G illustrates an example of the resulting structure after deposition and planarization of etch resistant caps 320 on etch resistant layers 318, according to one embodiment. Etch resistant cap 320 material further supports a low etch rate and can be, for instance, an oxide, a nitride, or a carbide employing any common metal, such as titanium, hafnium, aluminum, scandium, yttrium, zirconium, niobium, ruthenium, tantalum, lanthanum, and lutetium. In general, etch resistant cap 320 material should have relatively high resistivity (comparable to an insulator). Etch resistant caps 320 can be provided using any number of suitable deposition processes, but in one embodiment, etch resistant caps 320 are conformally deposited using ALD. Any excess of etch resistant cap 320 material is then planarized off such that only the regions in the pinched off neck of nitride or other etch resistant layer 318 material remain. Other deposition techniques such as chemical vapor deposition (CVD) and physical vapor deposition (PVD) can be used as well, but may necessitate an alignment aspect to the forming process for the isolation walls, as will be appreciated.

Figure 3H:
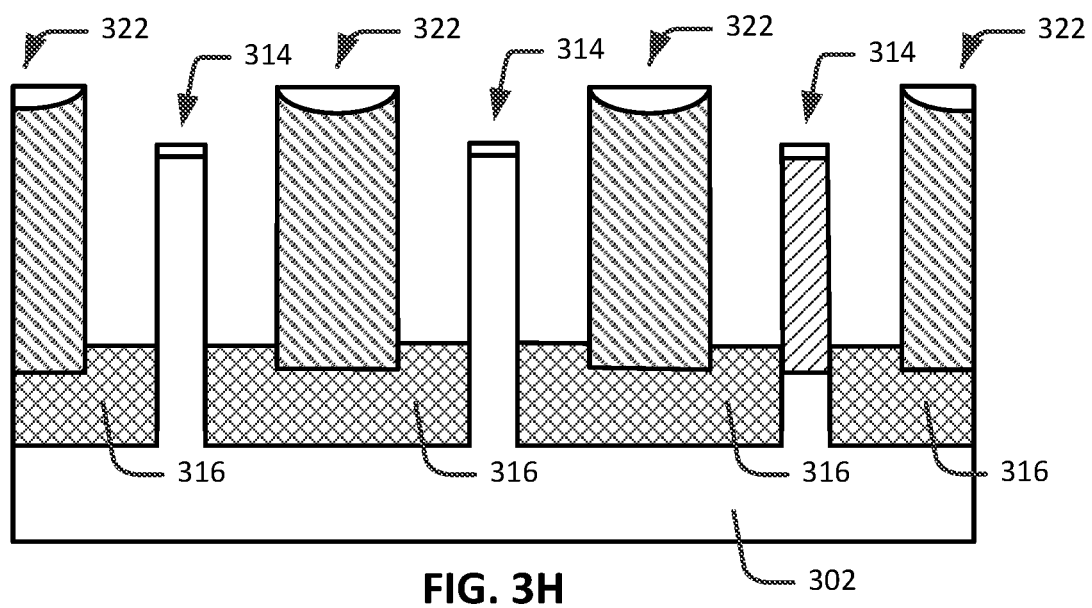

At block 216, the STI layers are etched to expose the fins and self-aligned isolation walls. FIG. 3H illustrates an example of the resulting structure after this etching of STI layers 316 to expose fins 314 and self-aligned isolation walls 314. Any suitable etch process (e.g., wet and/or dry) can be used to recess STI layers 316. For instance, in some embodiments, the STI recess process is carried out using an etchant that is selective to the fin and isolation wall materials (doesn't etch the fin and isolation wall materials or otherwise etches the fin and isolation wall materials at a rate that is 3× or more slower than the STI material). As illustrated, there are two isolation walls 314 and portions of two other isolation walls 314, but any number of configurations can be used. To this end, note that an isolation wall can be between every fin or just some of the fins. For instance, an isolation wall can be between every fin, or every two fins, or every three fins, etc. In other embodiments, the isolation walls may be formed in an irregular or otherwise non-repeating pattern. In a more general sense, the isolation walls can be provided in a gate edge aligned fashion as provided herein, wherever there is a need for isolation between neighboring fins, in a given integrated circuit layout.

As will be appreciated, a mask that is impervious or otherwise suitably resistant to the STI etchant, such as passivation layer 308 described previously, can be patterned to protect the fins, if necessary. Etch resistant cap 320 can be used to protect isolation walls 314 (along with etch resistant layer 318 material), as previously explained. Note that isolation walls 314 remain substantially intact after the STI recess process. The depth of the STI recess can vary from one embodiment to the next, and in this example embodiment is above the top of the remaining fin stub (or pedestal) of fin 314 including the alternate channel material. Further note that in this example embodiment isolation walls 314 are at least partially in STI layer 316. That is, the depth of the STI recess does not go beyond the bottom of the isolation walls. The depth of the STI recess will depend on factors such as the desired diffusion geometry, STI thickness and desired isolation, gate height, and/or fin height. In various embodiments, this partial removal of STI layer 316 may alter the width of one or more of the fins with the top of the fins ending up relatively narrower than the bottom of the fins in an embodiment. In other embodiments, the widths of the fins may remain relatively unchanged. In still other embodiments, the fins including the alternate channel material may have their width changed more than the fins not including the alternate channel material (native fins), or vice-versa.

At block 218, the integrated structure formation process is completed, as needed. For instance, the completion may include, for example, the formation of NMOS and/or PMOS transistors, which may include formation of gate structures over various sets of fins, as well as formation of source/drain regions, contact structure, interconnects, and other such features. Numerous configurations and embodiments will be apparent.

Figure 4:
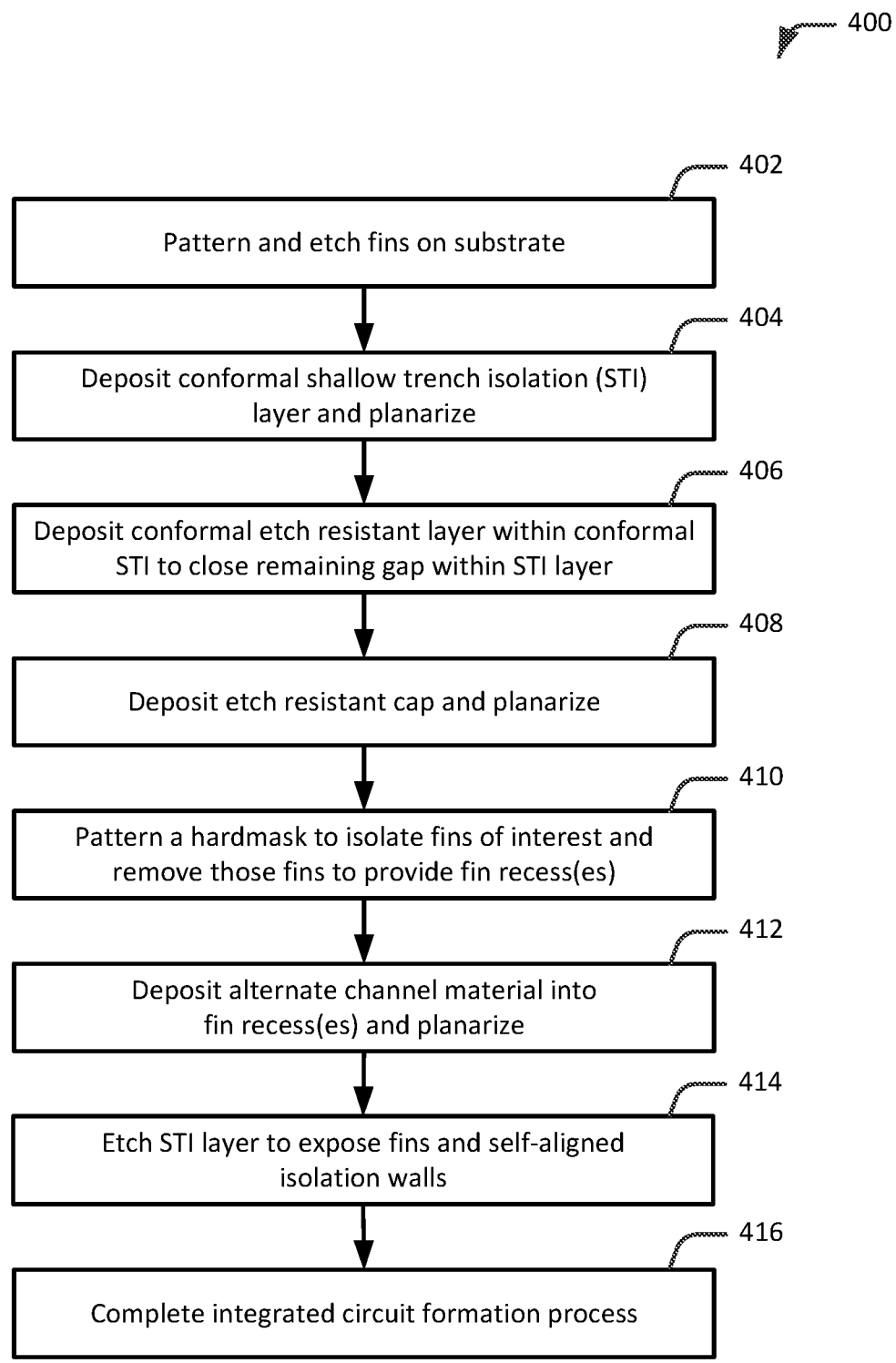
FIG. 4 is a flow diagram illustrating another example process for forming an integrated circuit structure that includes a self-aligned isolation wall and alternate channel material, in accordance with an embodiment of the present disclosure.

FIG. 4 is a flow diagram illustrating another example process 400 for forming an integrated circuit structure that includes a self-aligned isolation wall and alternate channel material, in accordance with an embodiment of the present disclosure. FIGS. 5A-5G illustrate structures that are formed when carrying out process 400 of FIG. 4, in accordance with an embodiment of the present disclosure. Concurrent reference to FIG. 4 and FIGS. 5A-5G will facilitate explanation.

Figure 5A:
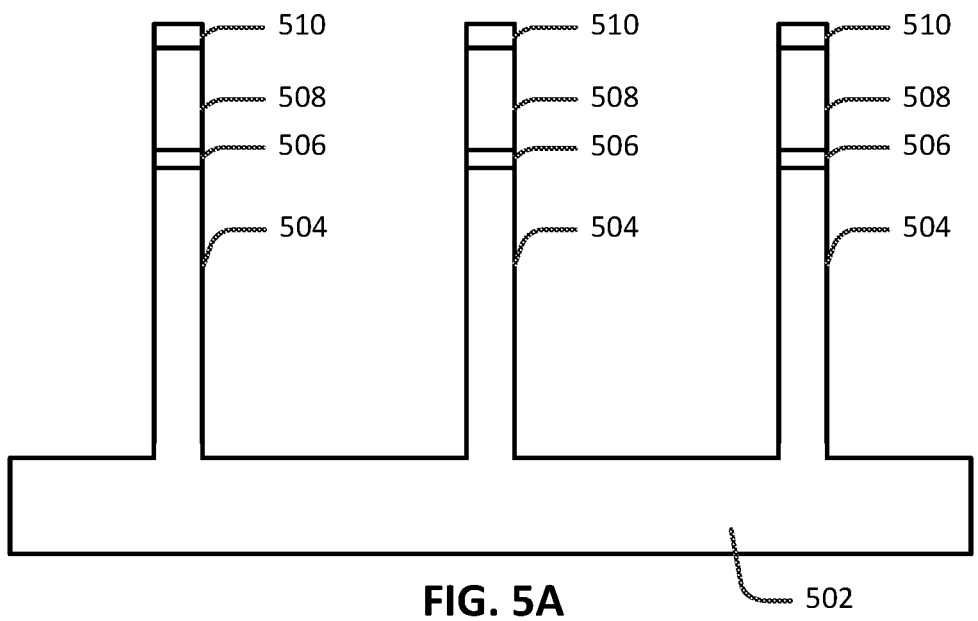
FIGS. 5A to 5G illustrate structures that are formed when carrying out the process of FIG. 4, in accordance with an embodiment of the present disclosure.

With reference to process 400 of FIG. 4, at block 402, a substrate is patterned and etched to form fins on the substrate. FIG. 5A illustrates an example of the resulting structure after formation of fins 504 on a substrate 502, according to one embodiment. Any number of suitable substrate configurations can be used, including bulk substrates, semiconductor-on-insulator substrates, and multi-layered structures. In a more general sense, any substrate upon which fins can be formed prior to a subsequent transistor formation process can be used. In one specific example case, substrate 502 is a bulk silicon substrate. Fins 504 can be formed using any number of suitable etch processes, but in one embodiment, fins 504 can be formed on substrate 502 using the STR etch process. As illustrated, according to one embodiment, a passivation layer 506, a dummy gate layer 508, and a hardmask layer 510 is patterned during the fin patterning. Passivation layer 506, dummy gate layer 508, and hardmask layer 510 are substantially similar to passivation layer 308, dummy gate layer 310, and hardmask layer 312, respectively, previously described, and that relevant discussion is equally applicable here.

Figure 5B:
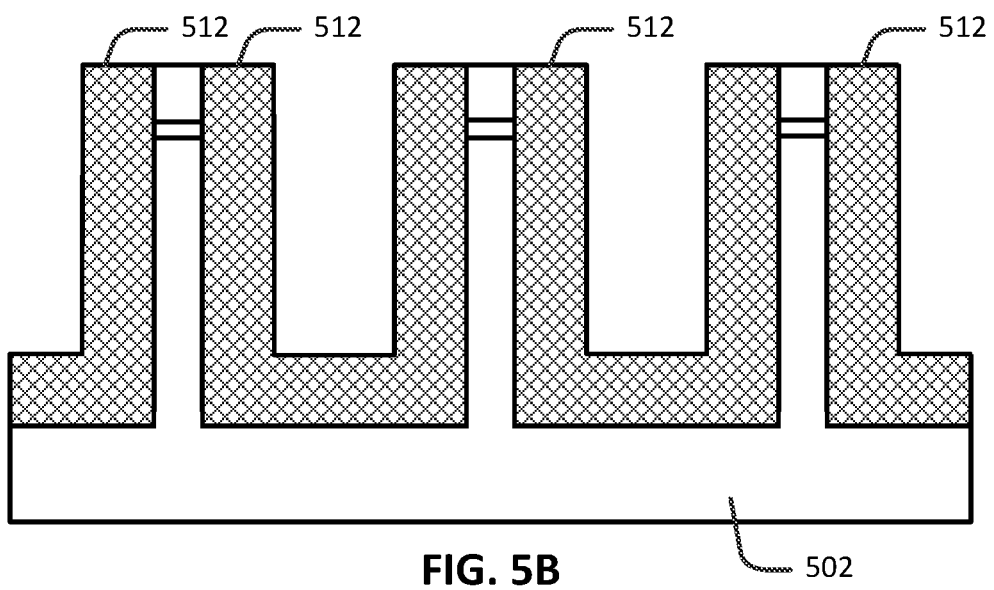
Figure 5C:
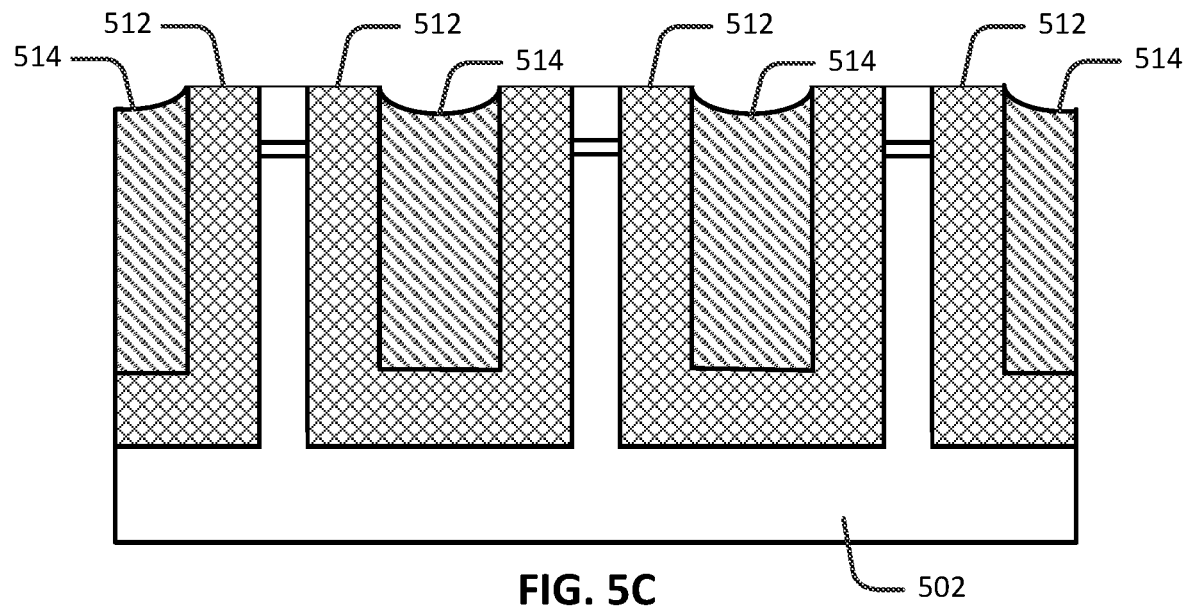
Figure 5D:
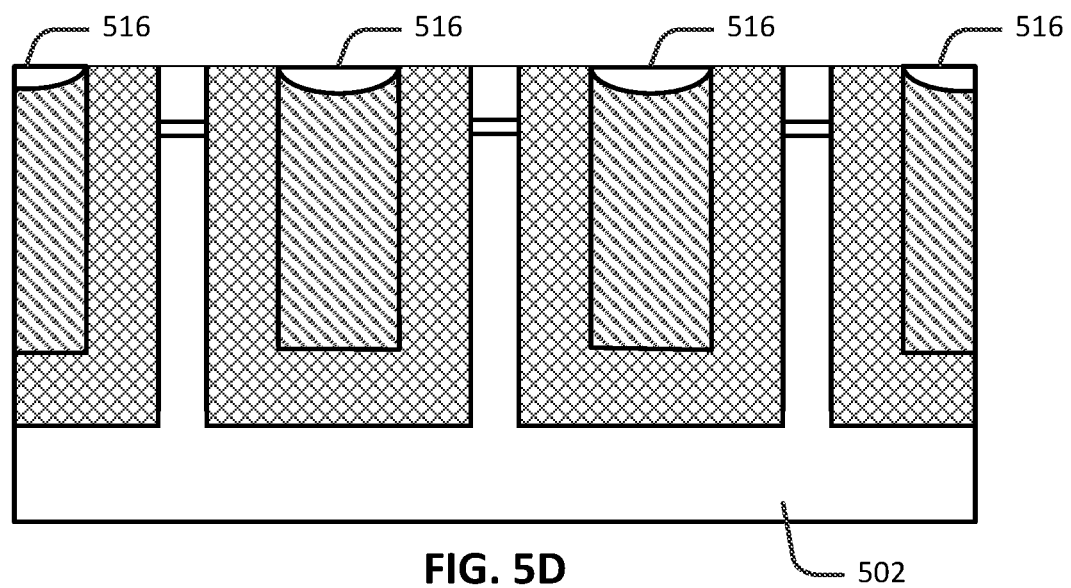

At block 404, a conformal STI layer is deposited in the trenches between the fins, and planarized. FIG. 5B illustrates an example of the resulting structure after deposition and planarization of STI layer 512 in the trenches, according to one embodiment. At block 406, a conformal etch resistant layer is deposited within the conformal STI to close remaining gaps within STI layer 512. FIG. 5C illustrates an example of the resulting structure after deposition of conformal etch resistant layer 514 in STI layer 512, according to one embodiment. At block 408, an etch resistant cap is deposited over the etch resistant layer, and planarized. FIG. 5D illustrates an example of the resulting structure after deposition and planarization of etch resistant caps 516 on etch resistant layers 514, according to one embodiment. The operations of blocks 404, 406, and 408 are substantially similar to the operations of blocks 210, 212, and 214, respectfully, previously described, and that relevant discussion is equally applicable here.

Figure 5E:
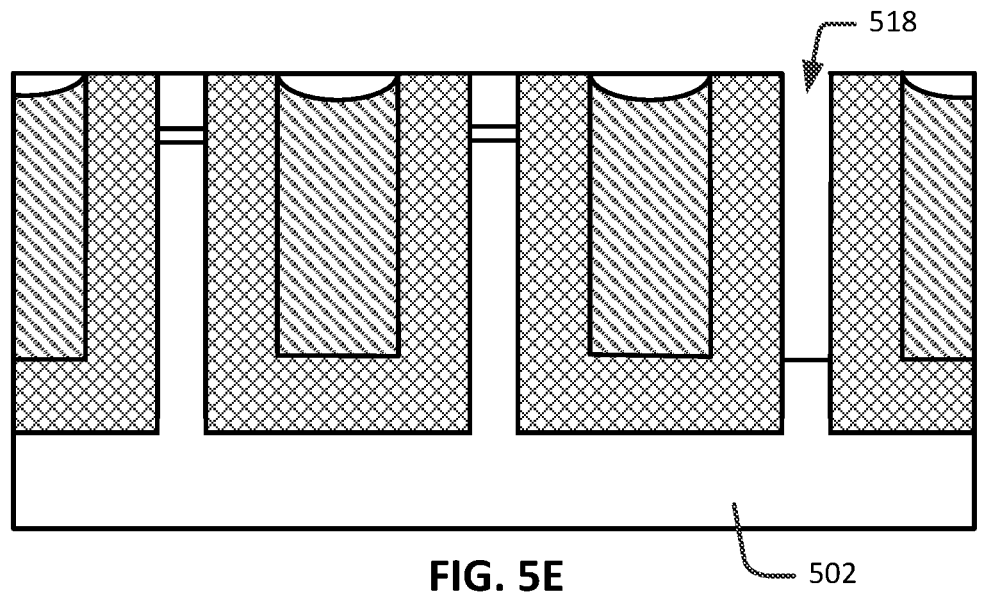

At block 410, a hardmask is patterned on the substrate to isolate fins of interest, and those fins (the fins of interest) are removed to provide fin recess(es). The hardmask can be, for example, provisioned anew or left intact from the fin forming process as previously described. In any case, the hardmask can be any suitable material that will withstand the fin removal etch of the unmasked fins and subsequent epitaxial processing to fill those recesses. FIG. 5E shows an example resulting structure where some of the fins are masked off with the hardmask, and others are left unmasked and removed or otherwise recessed, according to one embodiment. In the illustrated example case, there are three fins, and the rightmost fin is recessed to create a newly formed trench 518. Any suitable etch scheme can be used to recess the fins. In some embodiments, standard wet and/or dry etches are used to remove a bulk of the targeted material, but then low power dry plasma and/or low concentration NH$_4$OH wet etch can be used to fine tune the trench bottom morphology to a non-faceted low-ion damage surface upon which the alternate channel material can be grown or otherwise deposited, so as to provide a hybrid etch scheme.

Note that the recess etch performed at block 410 can be a selective etch such that it will remove the unmasked fin material but none or relatively little of the isolation structures (e.g., STI layers 512, conformal etch resistant layers 514, and etch resistant caps 516) or the hardmask. In such a case, note that the hardmask material may also be implemented with the STI material (e.g., silicon dioxide, silicon nitride) or any other material resistant to the fin recess etch scheme. In one specific example embodiment, the fins are silicon and the hardmask is silicon dioxide and/or silicon nitride, and the initial recess etch is carried out using a wet etch (e.g., potassium hydroxide or other suitable etchant that will remove the unmasked silicon fin material but not the STI material), followed by at least one of the low power dry plasma and low concentration NH$_4$OH wet etches to remove any faceting and ion damage so as to fine tune the bottom morphology of the trench(es). The depth of the fin etch can vary from one embodiment to the next, and may leave a pedestal (as shown in FIG. 5E), or a recess into the substrate past the original fin bottom (effectively, the mirror image of a pedestal, across the x-axis), or flush with the bottom of the STI trench. As will be further appreciated, the depth of the fin recess will depend on factors such as the desired channel configuration and material, substrate thickness, and/or fin height. In some embodiments, the etching process may alter the width of the recess(es), with the top of trench(es) being wider than the bottom in some such cases. In another embodiment where the original native fin was wider at the bottom than the top, the top of the trench may be widened to be closer to or exceed the width at the trench bottom. In yet another embodiment, the recess may end up with a slightly hourglass shape, wider at the top and bottom than in the middle. In yet another embodiment, the width may be substantially unchanged by the etching process. In a more general sense, the shape of the recess(es) may be changed by the etching process (to make wider) or a deposition onto sidewalls of the trench (to make narrower).

Figure 5F:
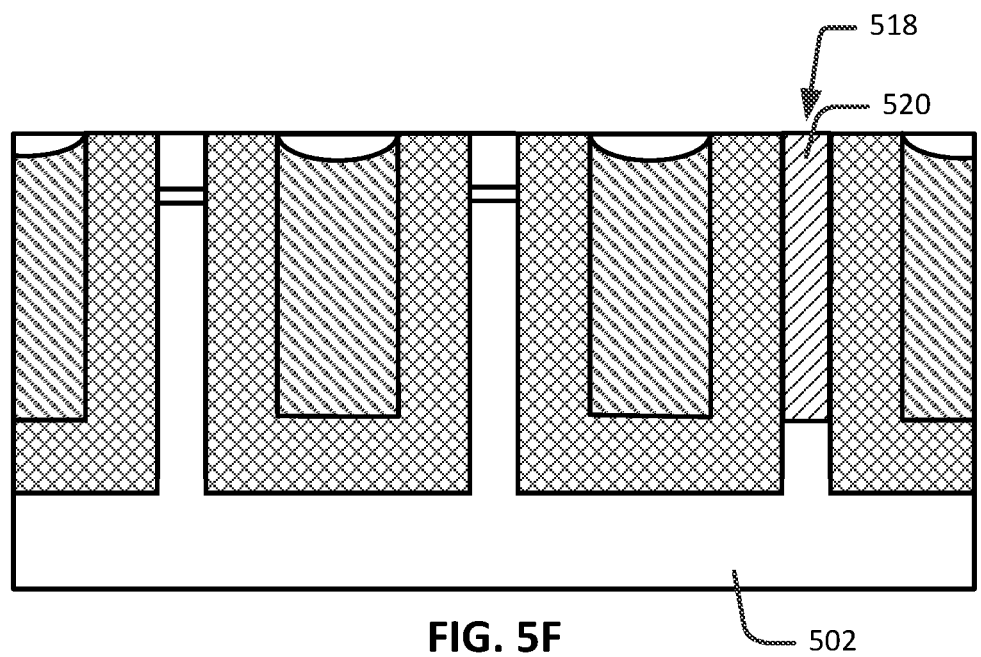

At block 412, alternate channel material is deposited into the fin recess(es) and planarized. FIG. 5F shows an example resulting structure after deposition of an alternate channel material 520 into trench 518, and planarization, according to one embodiment. As can be seen in this example case, trench 518 has been filled by way of epitaxial growth with a particular semiconductor material, alloy or compound (e.g., Si, Ge, SiGE, SiGE:C, or group III-V semiconductor materials for NMOS; Ge, SiGe, or SiGe:C for PMOS). The epitaxial material can be configured as desired with respect to any number of parameters of interest, such as layer thickness, polarity, doping, composition and/or strain. Note that the epitaxial deposition may result in some excess material that extends from the surface of STI layer 512 and may be misshapen, faceted, or irregular. Such excess material can be removed by planarization so that the resulting fin including alternate channel material 520 can be co-planar with STI layer 512 and etch resistant caps 516 as further shown in FIG. 5F. Any suitable deposition techniques such as chemical vapor deposition (CVD), rapid thermal CVD (RT-CVD), and gas-source molecular beam epitaxy (GS-MBE) can be used to provide alternate channel material 520.

Example trench-based semiconductor fin forming techniques are provided, for instance, in U.S. Patent Application Publication 2014/0027860. In some such cases, the replacement fin material is provided as alternating layers of desired channel material and sacrificial/inactive material such as described in U.S. Patent Application Publication 2016/0260802. Such multilayer fins are particularly useful for forming nanowire and nanoribbon transistors (e.g., during final gate processing, prior to deposition of final gate materials). In some cases, a first set of fins is formed with a first semiconductor material system (e.g., material having a high-germanium concentration for p-type non-planar transistor devices), and a second set of fins is formed with a second semiconductor material system (e.g., material having a high silicon or indium concentration for n-type non-planar transistor devices). Any number of fin forming processes can be used in the context of the present disclosure, as will be appreciated. In a more general sense, the fins can be any materials suitable for a given integrated circuit application.

Figure 5G:
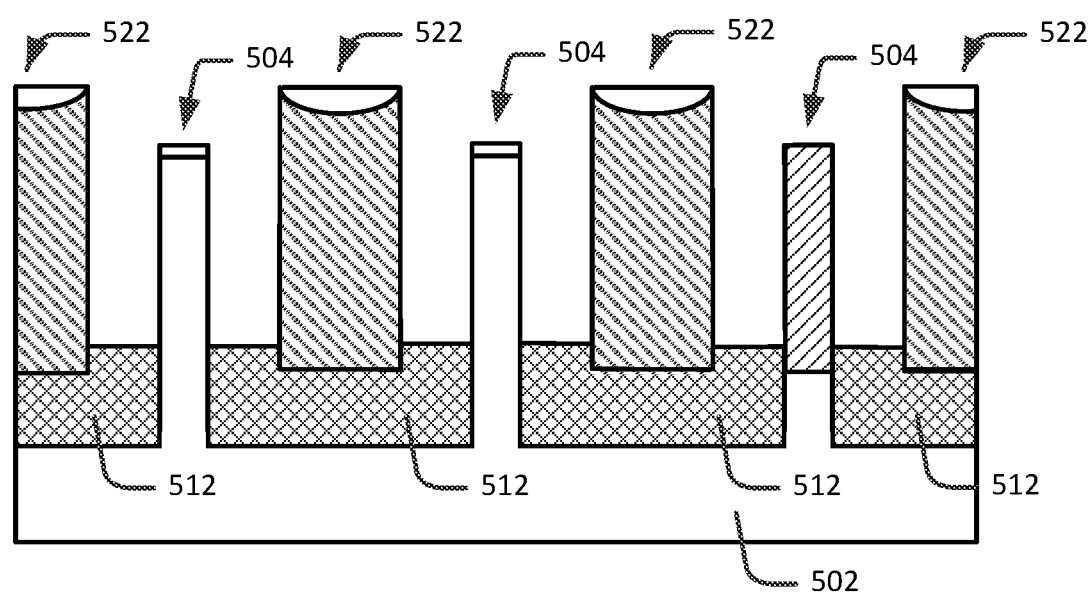

At block 414, the STI layers are etched to expose the fins and self-aligned isolation walls. FIG. 5G illustrates an example of the resulting structure after this etching of STI layers 512 to expose fins 504 and self-aligned isolation walls 522. The operations of block 414 is substantially similar to the operations of block 216 previously described, and that relevant discussion is equally applicable here. Note that fin 504 including alternate channel material 520 does not include a passivation layer as included on top of native fins 520, according to some embodiments.

At block 416, the integrated structure formation process is completed, as needed. For instance, the completion may include, for example, the formation of NMOS and/or PMOS transistors, which may include formation of gate structures over various sets of fins, as well as formation of source/drain regions, contact structure, interconnects, and other such features. Numerous configurations and embodiments will be apparent.

Example System

Figure 6:
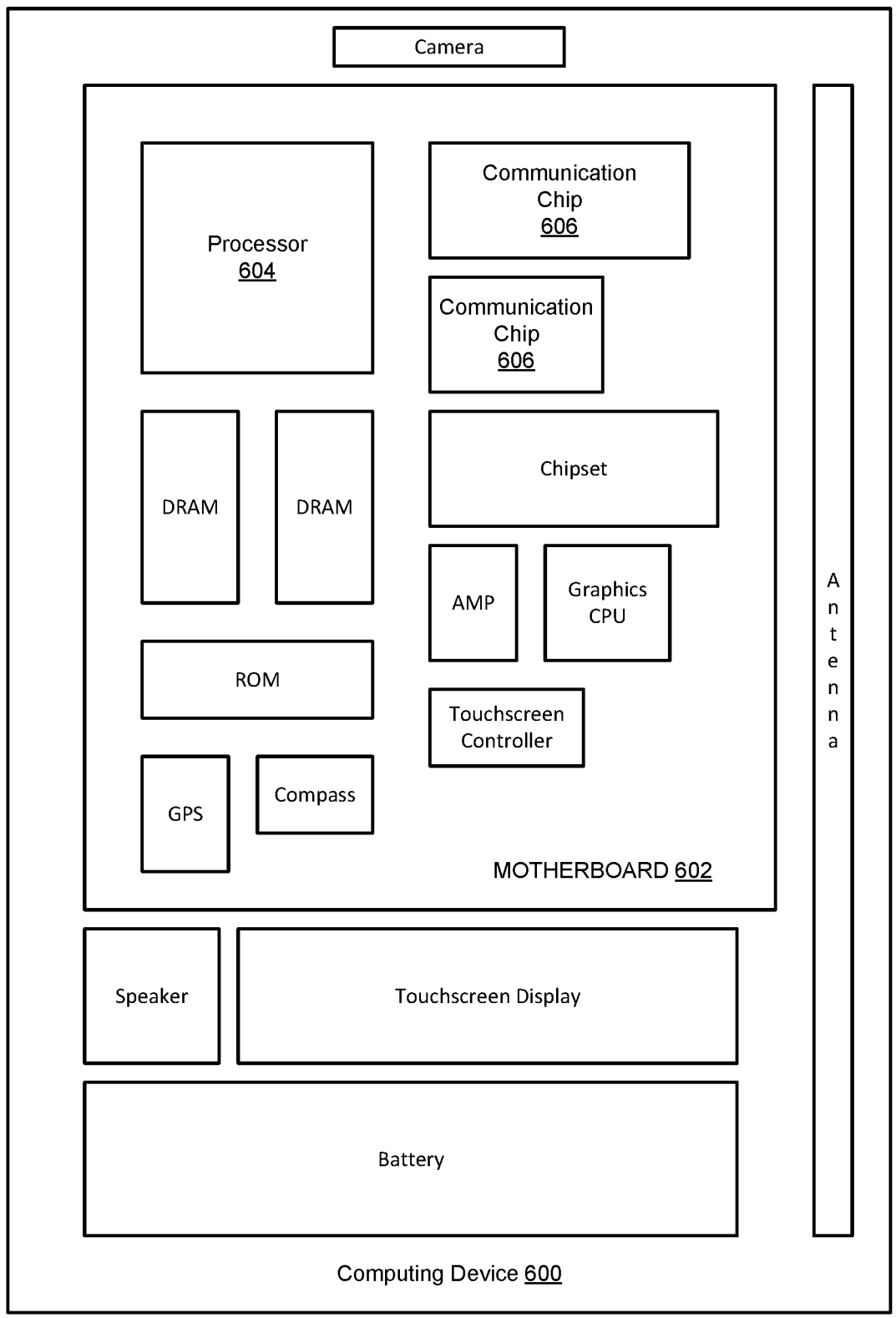
FIG. 6 is an example computing system implemented with one or more of the integrated circuit structures as disclosed herein, in accordance with an embodiment of the present disclosure.

FIG. 6 is an example computing system 600 implemented with one or more of the integrated circuit structures as disclosed herein, in accordance with an embodiment of the present disclosure. As can be seen, computing system 600 houses a motherboard 602. Motherboard 602 may include a number of components, including, but not limited to, a processor 604 and at least one communication chip 606, each of which can be physically and electrically coupled to motherboard 602, or otherwise integrated therein. As will be appreciated, motherboard 602 may be, for example, any printed circuit board, whether a main board, a daughterboard mounted on a main board, or the only board of system 600, etc.

Depending on its applications, computing system 600 may include one or more other components that may or may not be physically and electrically coupled to motherboard 602. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment (e.g., to include one or more semiconductor structures including alternate channel material and self-aligned gate edge architecture, as variously provided herein). In some embodiments, multiple functions can be integrated into one or more chips (e.g., for instance, note that communication chip 606 can be part of or otherwise integrated into processor 604).

Communication chip 606 enables wireless communications for the transfer of data to and from computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1x evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. Computing system 600 may include multiple communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others. In some embodiments, communication chip 606 may include one or more semiconductor structures including alternate channel material and self-aligned gate edge architecture as variously described herein.

Processor 604 of computing system 600 includes an integrated circuit die packaged within processor 604. In some embodiments, the integrated circuit die of the processor includes onboard circuitry that is implemented with one or more integrated circuit structures or devices having self-aligned gate edge isolation structures and alternate channel materials as various described herein. The term "processor" may refer to any device or portion of a device that processes, for instance, electronic data from registers and/or memory to transform that electronic data into other electronic data that may be stored in registers and/or memory.

Communication chip 606 also may include an integrated circuit die packaged within communication chip 606. In accordance with some such example embodiments, the integrated circuit die of the communication chip includes one or more integrated circuit structures or devices having self-aligned gate edge isolation structures and alternate channel materials as variously described herein. As will be appreciated in light of this disclosure, note that multi-standard wireless capability may be integrated directly into processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 includes an integrated circuit comprising: a first set of one or more fins including a first fin, the first fin comprising a first semiconductor material; a first gate structure over the first set of fins and in contact with the first semiconductor material, the first gate structure having opposing first and second sides; a second set of one or more fins including a second fin, the second fin comprising a second semiconductor material; a second gate structure over the second set of fins and in contact with the second semiconductor material, the second gate structure having opposing first and second sides; a substrate below the fins, the substrate comprising a third semiconductor material compositionally different from the first semiconductor material; and an isolation wall laterally adjacent to the second side of the first gate structure and the first side of the second gate structure, the isolation wall having a first sidewall that is a first distance from a right sidewall of a rightmost fin of the first set of fins, the isolation wall having a second sidewall that is a second distance from a left sidewall of a leftmost fin of the second set of fins; wherein the difference between the first and second distances is 2 nm or less, and the first and second distances being measured in the same horizontal plane.

Example 2 includes the subject matter of Example 1, wherein the difference between the first and second distances is 1 nm or less.

Example 3 includes the subject matter of Example 1, wherein the difference between the first and second distances is 0.5 nm or less.

Example 4 includes the subject matter of Example 1, wherein the isolation wall is centered between the first gate structure and the second gate structure.

Example 5 includes the subject matter of any of Examples 1 through 4, wherein the isolation wall is a first isolation wall, the integrated circuit further comprising: a second isolation wall laterally adjacent to the first side of the first gate structure, the second isolation wall having a sidewall that is a third distance from a left sidewall of a leftmost fin of the first set of fins; wherein the difference between the first and third distances is 2 nm or less, and the first and third distances being measured in the same horizontal plane.

Example 6 includes the subject matter of Example 5, wherein the difference between the first and third distances is 1 nm or less.

Example 7 includes the subject matter of Example 5, wherein the difference between the first and third distances is 0.5 nm or less.

Example 8 includes the subject matter of any of Examples 1 through 7, wherein the third semiconductor material is compositionally different from the second semiconductor material.

Example 9 includes the subject matter of any of Examples 1 through 8, wherein the first semiconductor material is compositionally different from the second semiconductor material.

Example 10 includes the subject matter of any of Examples 1 through 8, wherein the first semiconductor material is compositionally the same as the second semiconductor material.

Example 11 includes the subject matter of any of Examples 1 through 10, wherein the first gate structure is part of a PMOS transistor, and the first semiconductor material is germanium.

Example 12 includes the subject matter of any of Examples 1 through 10, wherein the first gate structure is part of a PMOS transistor, and the first semiconductor material comprises silicon and germanium.

Example 13 includes the subject matter of any of Examples 1 through 10, wherein the first gate structure is part of a PMOS transistor, and the first semiconductor material comprises silicon, germanium, and carbon.

Example 14 includes the subject matter of any of Examples 1 through 10, wherein the first gate structure is part of an NMOS transistor, and the first semiconductor material is silicon.

Example 15 includes the subject matter of any of Examples 1 through 10, wherein the first gate structure is part of an NMOS transistor, and the first semiconductor material is germanium.

Example 16 includes the subject matter of any of Examples 1 through 10, wherein the first gate structure is part of an NMOS transistor, and the first semiconductor material comprises silicon and germanium.

Example 17 includes the subject matter of any of Examples 1 through 10, wherein the first gate structure is part of an NMOS transistor, and the first semiconductor material comprises silicon, germanium, and carbon.

Example 18 includes the subject matter of any of Examples 1 through 10, wherein the first gate structure is part of an NMOS transistor, and the first semiconductor material is a group III-V semiconductor material.

Example 19 includes the subject matter of any of Examples 1 through 18, wherein the first set of fins includes a plurality of first fins, the second set of fins includes a plurality of second fins, the plurality of first fins being a different number than the plurality of second fins.

Example 20 includes the subject matter of any of Examples 1 through 19, wherein the first fin comprises a fin stub portion and a first semiconductor material portion above the fin stub portion.

Example 21 includes the subject matter of Example 20, wherein the fin stub portion is continuous with and protrudes from the substrate.

Example 22 includes a method for forming an integrated circuit structure, the method comprising: forming a first trench on a substrate, the substrate comprising a first semiconductor material; depositing a second semiconductor material into the first trench, the second semiconductor material compositionally different from the first semiconductor material; forming a plurality of fins on the substrate, at least some of the plurality of fins including the second semiconductor material; and forming an isolation wall between a first set of the plurality of fins and a second set of the plurality of fins, the isolation wall having a first sidewall that is a first distance from a right sidewall of a rightmost fin of the first set of fins, the isolation wall having a second sidewall that is a second distance from a left sidewall of a leftmost fin of the second set of fins; wherein the first set of fins includes at least one fin including the second semiconductor material; wherein the difference between the first and second distances is 2 nm or less, and the first and second distances being measured in the same horizontal plane.

Example 23 includes the subject matter of Example 22, wherein the first set of fins for forming a PMOS transistor, and the second semiconductor material being one of Ge, SiGe, or SiGe:C.

Example 24 includes the subject matter of Example 22, wherein the first set of fins for forming an NMOS transistor, and the second semiconductor material being one of Si, Ge, SiGe, SiGe:C, or a group III-V semiconductor material.

Example 25 includes the subject matter of any of Examples 22 through 24, wherein the isolation wall is centered between the first set of fins and the second set of fins.

Example 26 includes the subject matter of any of Examples 22 through 25, wherein the first set of fins includes a number of fins that is different than the second set of fins.

Example 27 includes the subject matter of any of Examples 22 through 26, wherein the at least one fin including the second semiconductor material comprises a fin stub portion and a second semiconductor material portion above the fin stub portion.

Example 28 includes the subject matter of any of Examples 22 through 27, wherein the at least one fin including the second semiconductor material comprises a fin stub portion that is continuous with and protrudes from the substrate.

Example 29 includes the subject matter of any of Examples 22 through 28, further comprising: forming a second trench on the substrate; and depositing a third alternate channel material into the second trench; wherein the second set of fins includes at least one fin including the third semiconductor material.

Example 30 includes the subject matter of Example 29, wherein the second semiconductor material is a material optimized for electron flow, and the third semiconductor material is a material optimized for hole flow.

Example 31 includes the subject matter of Example 29 or 30, wherein the second semiconductor material is compositionally different from the third semiconductor material.

Example 32 includes the subject matter of Example 29 or 30, wherein the second semiconductor material is compositionally the same as the third semiconductor material.

Example 33 includes a method for forming an integrated circuit structure, the method comprising: forming a plurality of fins on a substrate, the substrate comprising a first semiconductor material; forming an isolation structure between a first set of the plurality of fins and a second set of the plurality of fins; removing a first fin of the first set of fins to provide a first fin recess; depositing a second semiconductor material into the first fin recess, the second semiconductor material compositionally different from the first semiconductor material, the first fin including the second semiconductor material; and forming an isolation wall between the first set of fins and the second set of fins, the isolation wall having a first sidewall that is a first distance from a right sidewall of a rightmost fin of the first set of fins, the isolation wall having a second sidewall that is a second distance from a left sidewall of a leftmost fin of the second set of fins; wherein the difference between the first and second distances is 2 nm or less, and the first and second distances being measured in the same horizontal plane.

Example 34 includes the subject matter of Example 33, wherein the difference between the first and second distances is 1 nm or less.

Example 35 includes the subject matter of Example 33, wherein the difference between the first and second distances is 0.5 nm or less.

Example 36 includes the subject matter of Example 33, wherein the isolation wall is centered between the first set of fins and the second set of fins.

Example 37 includes the subject matter of any of Examples 33 through 36, wherein the first fin is for forming a PMOS transistor, and the second semiconductor material being one of Ge, SiGe, or SiGe:C.

Example 38 includes the subject matter of any of Examples 33 through 36, wherein the first fin is for forming an NMOS transistor, and the second semiconductor material being one of Si, Ge, SiGe, SiGe:C, or a group III-V semiconductor material.

Example 39 includes the subject matter of any of Examples 33 through 38, wherein the first fin comprises a fin stub portion and a second semiconductor material portion above the fin stub portion.

Example 40 includes the subject matter of any of Examples 33 through 39, wherein the first fin comprises a fin stub portion that is continuous with and protrudes from the substrate.

Example 41 includes the subject matter of any of Examples 33 through 40, further comprising: removing a second fin of the second set of fins to provide a second fin recess; and depositing a third semiconductor material into the second fin recess, the third semiconductor material compositionally different from the first semiconductor material, the second fin including the third semiconductor material.

Example 42 includes the subject matter of Example 41, wherein the second semiconductor material is a material optimized for electron flow, and the third semiconductor material is a material optimized for hole flow.

Example 43 includes the subject matter of any of Examples 33 through 42, wherein the second semiconductor material is compositionally different from the third semiconductor material.

Example 44 includes the subject matter of any of Examples 33 through 42, wherein the second semiconductor material is compositionally the same as the third semiconductor material.

Terms used in the present disclosure and in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure. Accordingly, it is intended that the scope of the present disclosure be limited not by this detailed description, but rather by the claims appended hereto.

What is claimed is:

1. An integrated circuit structure, comprising:
   a first set of one or more fins including a first fin, the first fin comprising a first semiconductor material;
   a first gate structure over the first set of fins and in contact with the first semiconductor material, the first gate structure having opposing first and second sides;
   a second set of one or more fins including a second fin, the second fin comprising a second semiconductor material;
   a second gate structure over the second set of fins and in contact with the second semiconductor material, the second gate structure having opposing first and second sides;
   a substrate below the fins, the substrate comprising a third semiconductor material compositionally different from the first semiconductor material, wherein the first fin is on a fin stub, the fin stub comprising the third semiconductor material; and
   an isolation wall laterally adjacent to the second side of the first gate structure and the first side of the second gate structure, the isolation wall having a first sidewall that is a first distance from a right sidewall of a rightmost fin of the first set of fins, the isolation wall having a second sidewall that is a second distance from a left sidewall of a leftmost fin of the second set of fins;
   wherein the difference between the first and second distances is 2 nm or less, and the first and second distances being measured in the same horizontal plane.

2. The integrated circuit of claim 1, wherein the difference between the first and second distances is 1 nm or less.

3. The integrated circuit of claim 1, wherein the difference between the first and second distances is 0.5 nm or less.

4. The integrated circuit of claim 1, wherein the isolation wall is centered between the first gate structure and the second gate structure.

5. The integrated circuit of claim 1, wherein the isolation wall is a first isolation wall, the integrated circuit further comprising:

a second isolation wall laterally adjacent to the first side of the first gate structure, the second isolation wall having a sidewall that is a third distance from a left sidewall of a leftmost fin of the first set of fins;

wherein the difference between the first and third distances is 2 nm or less, and the first and third distances being measured in the same horizontal plane.

6. The integrated circuit of claim 5, wherein the difference between the first and third distances is 1 nm or less.

7. The integrated circuit of claim 5, wherein the difference between the first and third distances is 0.5 nm or less.

8. The integrated circuit of claim 1, wherein the third semiconductor material is compositionally different from the second semiconductor material.

9. The integrated circuit of claim 1, wherein the first semiconductor material is compositionally different from the second semiconductor material.

10. The integrated circuit of claim 1, wherein the first semiconductor material is compositionally the same as the second semiconductor material.

11. The integrated circuit of claim 1, wherein the first gate structure is part of a PMOS transistor, and the first semiconductor material is germanium.

12. The integrated circuit of claim 1, wherein the first gate structure is part of a PMOS transistor, and the first semiconductor material comprises silicon and germanium.

13. The integrated circuit of claim 1, wherein the first gate structure is part of a PMOS transistor, and the first semiconductor material comprises silicon, germanium, and carbon.

14. The integrated circuit of claim 1, wherein the first gate structure is part of an NMOS transistor, and the first semiconductor material is silicon.

15. The integrated circuit of claim 1, wherein the first gate structure is part of an NMOS transistor, and the first semiconductor material is germanium.

16. The integrated circuit of claim 1, wherein the first gate structure is part of an NMOS transistor, and the first semiconductor material comprises silicon and germanium.

17. The integrated circuit of claim 1, wherein the first gate structure is part of an NMOS transistor, and the first semiconductor material comprises silicon, germanium, and carbon.

18. The integrated circuit of claim 1, wherein the first gate structure is part of an NMOS transistor, and the first semiconductor material is a group III-V semiconductor material.

19. The integrated circuit of claim 1, wherein the first set of fins includes a plurality of first fins, the second set of fins includes a plurality of second fins, the plurality of first fins being a different number than the plurality of second fins.

* * * * *